(12) United States Patent
Warnaar

(10) Patent No.: US 7,989,966 B2
(45) Date of Patent: Aug. 2, 2011

(54) MARK STRUCTURE FOR COARSE WAFER ALIGNMENT AND METHOD FOR MANUFACTURING SUCH A MARK STRUCTURE

(75) Inventor: Patrick Warnaar, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 366 days.

(21) Appl. No.: 12/372,092

(22) Filed: Feb. 17, 2009

(65) Prior Publication Data

US 2009/0212447 A1  Aug. 27, 2009

Related U.S. Application Data

(60) Provisional application No. 61/064,193, filed on Feb. 21, 2008.

(51) Int. Cl.
*H01L 23/544* (2006.01)
*H01L 21/76* (2006.01)
*H01L 21/46* (2006.01)

(52) U.S. Cl. .................... 257/797; 438/401; 438/462

(58) Field of Classification Search .................. 438/401, 438/462, 975; 257/797
See application file for complete search history.

(56) References Cited

U.S. PATENT DOCUMENTS

| 7,319,506 B2* | 1/2008 | Den Boef et al. ............... 355/53 |
| 7,332,732 B2* | 2/2008 | Van Bilsen et al. ........... 250/548 |
| 7,863,763 B2* | 1/2011 | Van Haren et al. ........... 257/797 |
| 2007/0114678 A1 | 5/2007 | Van Haren et al. |

FOREIGN PATENT DOCUMENTS

| EP | 1 372 040 A2 | 12/2003 |
| KR | 10-0777417 | 11/2007 |

OTHER PUBLICATIONS

English translation of Korean Office Action mailed Nov. 5, 2010, directed to related Korean Application No. 10-2009-0012777, Korean Intellectual Property Office; 3 pages.

* cited by examiner

*Primary Examiner* — Calvin Lee
(74) *Attorney, Agent, or Firm* — Sterne, Kessler, Goldstein & Fox P.L.L.C

(57) ABSTRACT

A mark structure includes on a substrate, at least four lines. The lines extend parallel to each other in a first direction and are arranged with a pitch between each pair of lines that is directed in a second direction perpendicular to the first direction. The pitch between each pair of selected lines differs from the pitch between each other pair of selected lines.

8 Claims, 4 Drawing Sheets

MARK STRUCTURE FOR COARSE WAFER ALIGNMENT AND METHOD FOR MANUFACTURING SUCH A MARK STRUCTURE

CROSS REFERENCE TO RELATED APPLICATIONS

This application claims benefit under 35 U.S.C. §119(e) to U.S. Provisional Patent Application 61/064,193, filed Feb. 21, 2008, which is incorporated by reference herein in its entirety.

FIELD

The present invention relates to a mark structure for coarse wafer alignment in a lithographic apparatus. Also, the present invention relates to a manufacturing method for such a mark.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

For coarse optical alignment of a wafer in a lithographic apparatus, a mark structure (mark) is known, which comprises three parallel lines. The parallel lines are arranged in a scribe lane of the wafer and extend in the longitudinal direction of the scribe lane. Of the three lines of the mark, one pair of adjacent lines has a first pitch and the other pair of adjacent lines has a second pitch. The first and second pitch extend along the width direction of the scribe lane and the first pitch is different from the second pitch.

An optical alignment scan is performed along a scan path in this pitch direction (thus scan data is also gathered outside the scribe lane). The optical alignment scan is based on so-called self-referencing interferometry to obtain a scan data signal from the mark. The used self-referencing interferometry has been described in EP 1372040, which is incorporated by reference herein in its entirety. The position of the mark can be obtained by searching in the scan data signal for a signal portion that matches the two pitches of the mark-design, for example by a pattern recognition procedure. The location of the matching signal portion in the scan data signal relates to the position of the mark within the scan path.

It is however observed that when using the mark it is only possible to select an aligned position based on two pitches. It can happen that product structures, next to the mark and outside the scribe lane, resemble one or both of these pitches, which causes a misalignment.

Moreover, because any device structure next to the mark will cause interference with the mark itself, this will disturb the alignment performance. Therefore, the mark has an exclusion zone which must be left empty without device structure. For that reason, scribe lanes can not have a width below a minimal value. A reduction to lower values of the scribe lane width is not possible with coarse wafer alignment.

SUMMARY

According to an aspect of the present invention, there is provided a mark structure on a substrate, comprising a plurality of n lines, n being equal to at least four, the lines extending parallel to each other in a first direction and being arranged with a pitch between each pair of lines selected from the plurality of lines, the pitch being directed in a second direction perpendicular to the first direction, wherein the pitch between each pair of selected lines differs from the pitch between each other pair of selected lines.

According to an aspect, there is provided a semiconductor device comprising a mark structure as described above.

According to an aspect, there is provided a method for manufacturing a semiconductor device on a substrate, including, providing the substrate, creating by a lithographic process a mark structure on the substrate, wherein the mark structure includes a plurality of n lines, n being equal to at least four, the lines extending parallel to each other in a first direction and being arranged with a respective pitch between each pair of lines selected from the plurality of lines, the pitch being directed in a second direction perpendicular to the first direction, wherein the pitch between each pair of the selected lines differs from the pitch between each other pair of selected lines.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
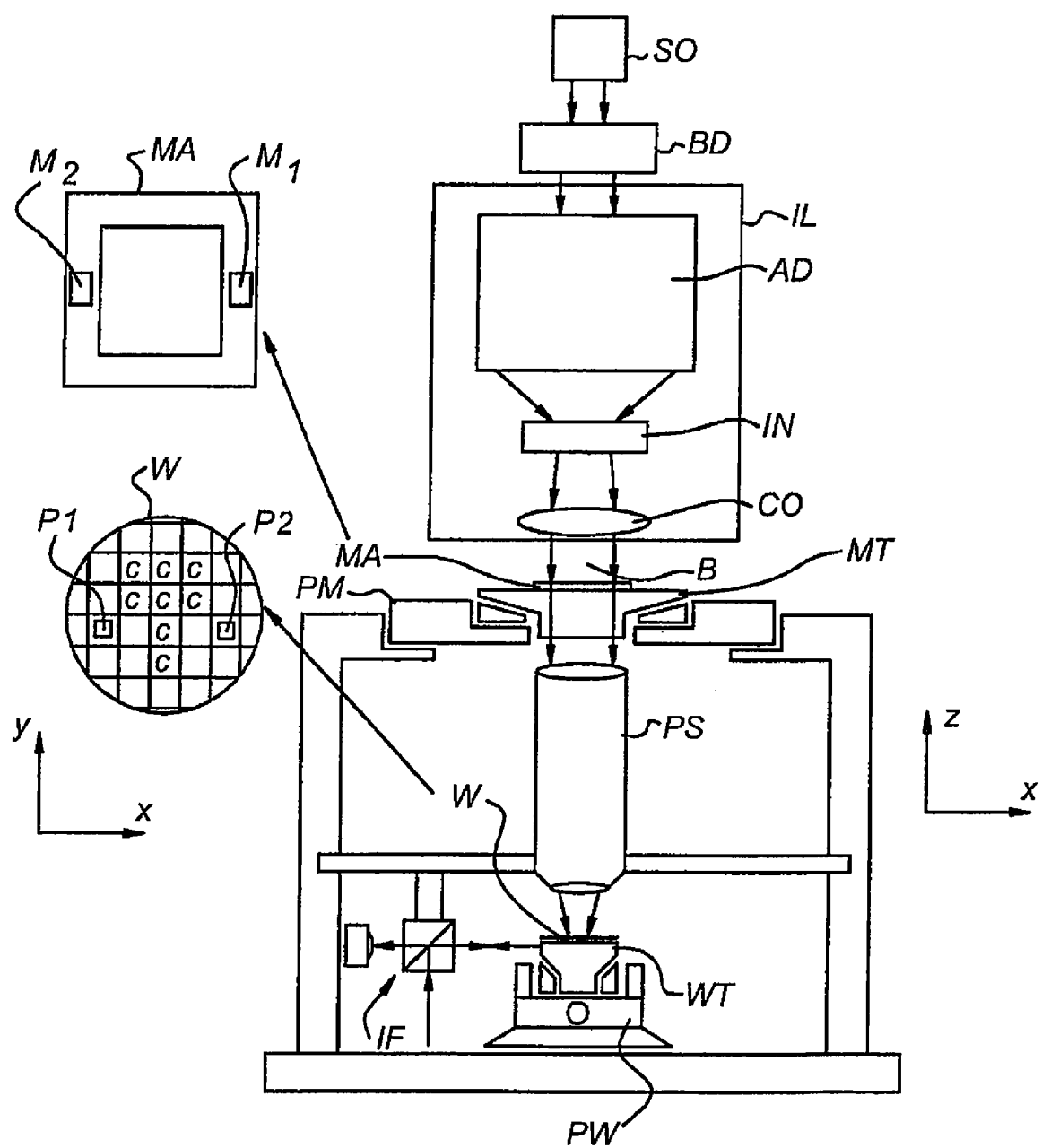
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g., UV radiation or EUV radiation);

a support structure (e.g., a mask table) MT constructed to support a patterning device (e.g., a mask) MA and connected to a first positioner PM configured to accurately position the patterning device in accordance with certain parameters;

a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
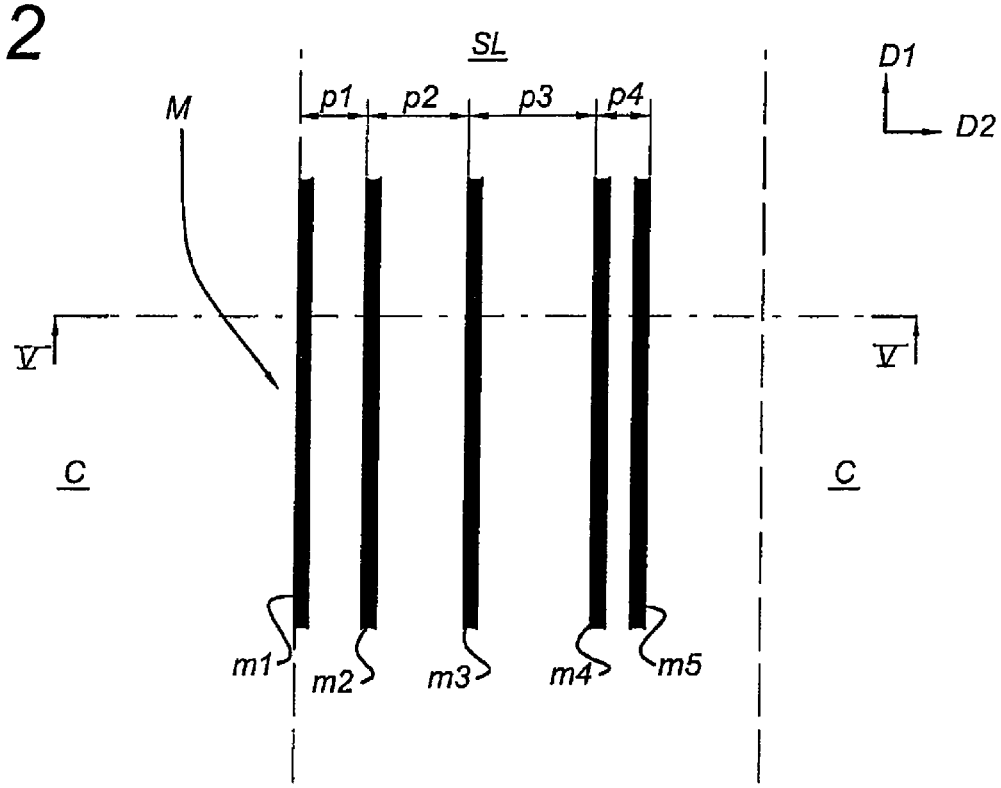
FIG. 2 depicts a mark structure in accordance with an embodiment of the present invention.

FIG. 2 depicts a top view of a mark structure M in accordance with an embodiment of the present invention.

Mark structure M is arranged in a scribe line SL that is intermediate two target portions C. The scribe line SL extends longitudinally in a first direction D1, and has a width in a second direction D2 perpendicular to the first direction D1.

The mark structure M comprises a plurality n of, at least four, lines M1, M2, M3, M4, M5 which extend in a longitudinal direction D1 of the scribe line SL. The n lines M1 . . . M5 are separated from each other by n−1 interspaces. Each interspace has a pitch different from the pitch of another interspace.

Line M1 and line M2 are separated by a first interspace with first pitch P1, line M2 and line M3 are separated by a second interspace with second pitch P2, line M3 and line M4 are separated by a third interspace with third pitch P3, and line M4 and line M5 are separated by a fourth interspace with fourth pitch P4.

Each of the first, second, third and fourth (P1, P2, P3, P4, or generally, n−1) pitches has a size different from the other pitches.

Due to the characteristics of the self-referencing interferometer, during an optical alignment scan, local intensity minima in the interferometry signal are obtained at positions of each of the plurality of n lines M1 . . . M5 in the mark structure and at interferences of two or more of the plurality of n lines M1 . . . M5.

Therefore, according to the present invention, the n−1 pitches and their ranking within the mark structure are selected in such a way that an interference pattern measured on the mark structure M by the self referencing interferometer reveals only local intensity minima without substantially overlapping positions.

The mark structure is arranged for producing an optical interference pattern during an optical alignment in which the optical interference pattern displays a number of individual local intensity minima, that do not overlap.

The present invention allows to maximize the number of lines within the mark structure M, under the condition that during optical alignment scan a unique interference pattern can be generated by the mark structure M.

In FIG. 2 as an example, a mark structure M is shown comprising 5 lines, each about 2 μm (microns) wide. The lines are spaced apart in which the first pitch P1 is about 9 μm, the second pitch P2 is about 13 μm, the third pitch P3 is about 17 μm and the fourth pitch P4 is about 5 μm. These dimensions are provided by way of example and not limitation.

Figure 3:
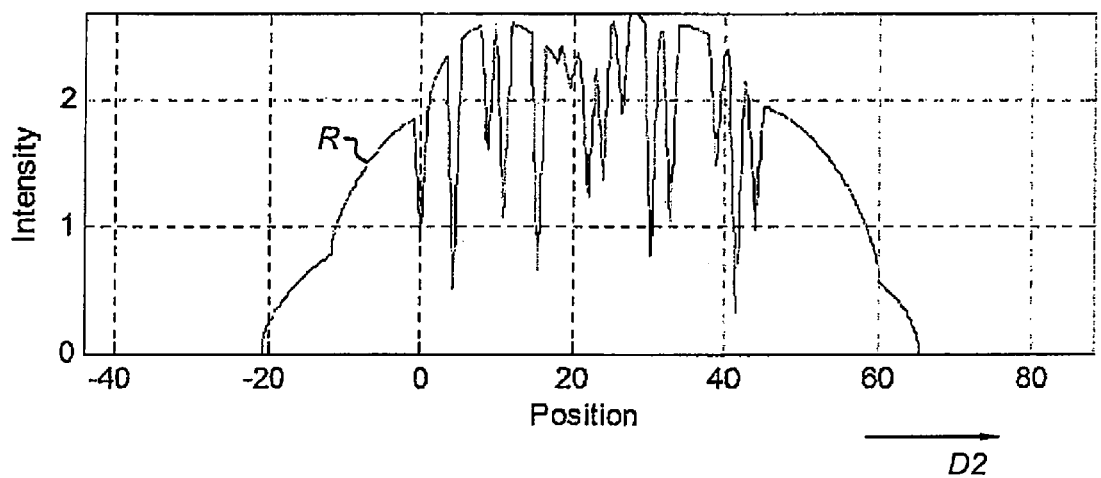
FIG. 3 depicts a response function of the mark structure of FIG. 2.

FIG. 3 depicts a plot of an interference pattern R of the exemplary mark structure M of FIG. 2, as would be measured during an optical alignment scan along a scan path across the scribe line SL in the second direction D2.

An illumination beam of a self referencing interferometer is provided as a spot on the substrate, for illuminating the mark structure. The self referencing interferometer uses at least four laser beams, each having a respective wavelength in the range between about 530 and about 850 nm and different from the wavelength of the other laser beams. In FIG. 3, the measured intensity (vertical axis) for a single wavelength is plotted as a function of the measurement position (horizontal axis) within the scribe line SL along the scan path in second direction D2.

Figure 4:
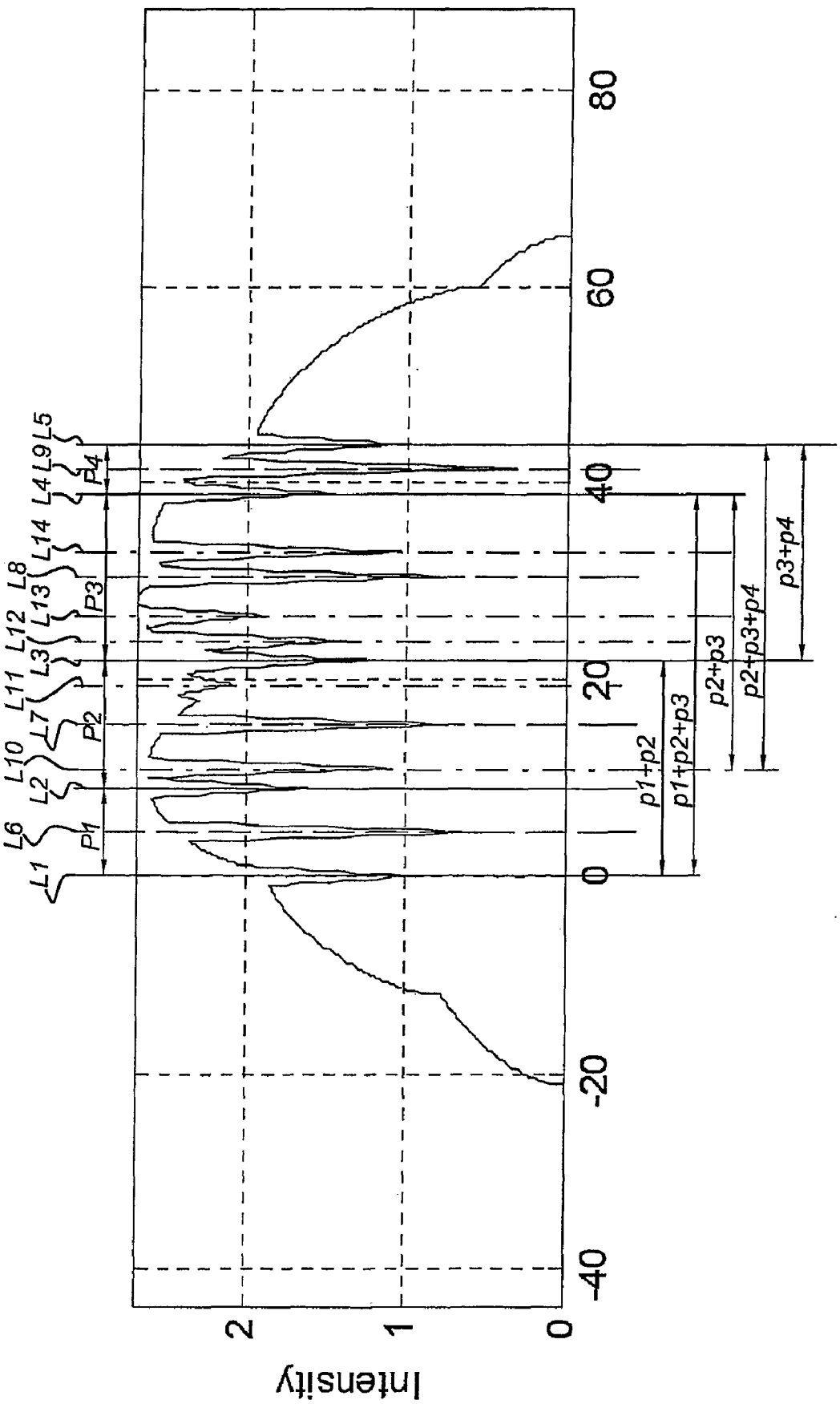
FIG. 4 depicts a relationship between the response function and the layout of the mark structure.

FIG. 4 depicts a relationship between the interference pattern R and the layout of the mark structure.

At the position of the lines M1 . . . M5 of the mark structure M, the interference pattern R displays primary local intensity minima with relatively reduced intensity. Primary local intensity minima are indicated by solid lines L1, L2, L3, L4, L5.

Also, secondary local intensity minima are displayed at interferences between two lines, i.e., at a secondary position halfway between each pair of adjacent lines, as indicated by dashed lines L6, L7, L8, L9.

Tertiary local intensity minima are generated at interferences between more than two lines, i.e., at a tertiary position halfway the two outer lines involved in each respective interference as indicated by dotted lines L10, L11, L12, L13, L14.

Due to the generation of secondary and tertiary local intensity minima, the information within interference pattern increases. As a result an increase in output accuracy can be expected which is proportional to the square root of the number of pitches within the mark structure divided by two.

The increase in output accuracy advantageously improves the process robustness because of the higher selectivity for the combination of specific pitches.

Which interference lines actually appear is related to which lines of the mark structure can interfere with each other. Clearly this is limited by an area or a predetermined distance which is illuminated by the sensor (spot diameter): Only lines at a pitch smaller than the spot diameter interfere, lines at larger pitch will not result in the generation of additional secondary and/or tertiary intensity minima.

The design of the mark structure, i.e., the position of each of the plurality of n lines in the mark structure can be determined by a brute force computation procedure for a mark layout with these properties, i.e., the interference pattern as produced by the self referencing interferometer displays a number of individual local intensity minima, wherein the positions of the local intensity minima as generated by the pattern of the mark structure M do not show any substantial overlap. The mark structure comprises a plurality of lines wherein the lines run substantially parallel and are arranged in a pattern with an interspace between each two adjacent lines. The interspaces are selected and ranked in such a way that the requirement of producing an interference pattern with substantially no overlap between individual local intensity minima is achieved. Illumination of the mark structure produces an optical interference pattern during an optical alignment in which the optical interference pattern displays a number of individual local intensity minima, that substantially do not overlap. By substantially parallel is meant that the lines may not in practice be perfectly straight, or may have local variations. What is intended is that they are sufficiently parallel (and a pitch between them sufficiently perpendicular) that they may serve the function of generating the required interference pattern.

The number of possible mark structure designs is limited by a number of input parameters such as width of the mark structure, number of lines in the mark structure, line width of each line in the mark, minimum allowed distance between local minima in the interference pattern.

For example, for the case of a mark with a width of about 60 µm, 5 lines of line width about 2 µm and a minimum distance between local minima of about 2 µm, still approximately 2500 line patterns can be constructed on a about 1 µm grid (i.e., the resolution of the grid of the mark structure is about 1 µm), which fulfill the requirement of substantially no overlap. All designs in which the same pitch occurs twice (or more) are excluded, since these designs would exhibit overlap of individual local intensity minima in the interference pattern.

On the remaining possible mark layouts (i.e., without pitches occurring twice or more) further optimizations can be applied to optimize for specific conditions (e.g., evenly distribution of lines inside the scribe lane, minimum or maximum difference between the various pitches).

Figure 5:
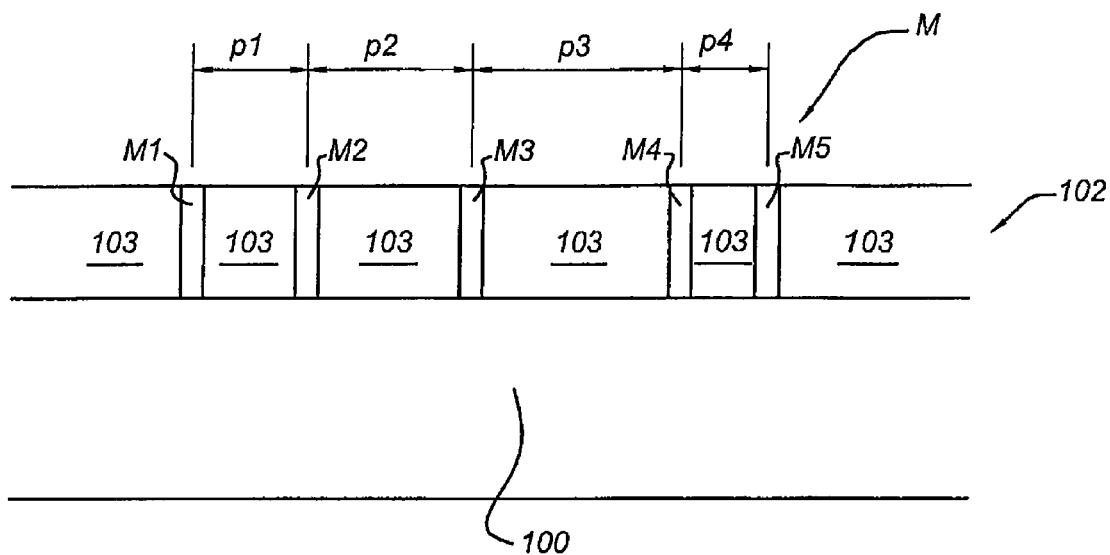
FIG. 5 depicts a cross-section of a mark structure in accordance with an embodiment of the present invention.

FIG. 5 depicts a cross-section of a mark structure in accordance with an embodiment of the present invention.

The cross-section is taken along line V-V as shown in FIG. 2. On a substrate 100, the mark structure M is defined by creating a plurality of n lines M1, M2, M3, M4, M5 in a first layer 102 on the surface of the substrate 100. The skilled person will appreciate the various lithographic processes that may be involved in the creation of the pattern of the n lines M1 . . . M5. The lines M1, M2, M3, M4, M5 may be formed from a first material such as a metal. The spaces 103 in between the lines M1, M2, M3, M4, M5 in the first layer 102 may be void or comprise a second material with different optical properties than the first material. The second material may comprise silicon dioxide.

Suitable combinations of first and second materials may include materials having a difference in reflectivity. Also first and second materials with properties that create a difference in phase contrast between lines M1 . . . M5 and spaces 103 may be used.

The transverse direction of the scribe line SL is indicated by arrow D2.

Figure 6:
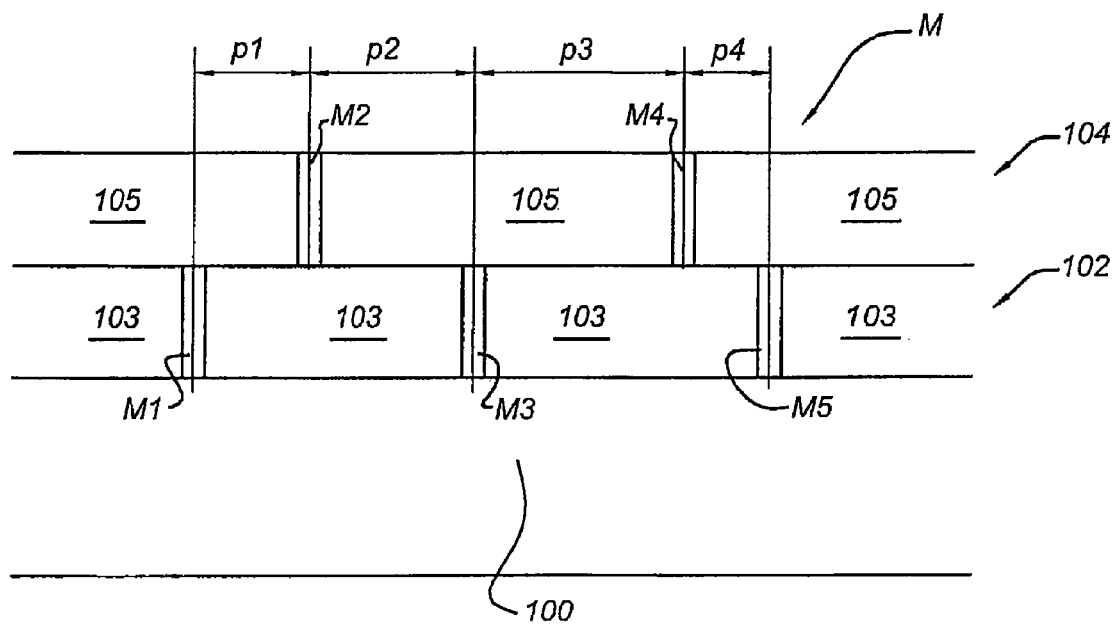
FIG. 6 depicts a cross-section of a mark structure in accordance with an embodiment of the present invention.

FIG. 6 depicts a cross-section of a mark structure in accordance with a further embodiment of the present invention. The cross-section is taken along line V-V as shown in FIG. 2.

The mark structure comprises a first subset of the plurality of lines that is located in a first layer on the substrate and a second subset of the plurality of lines that is located in a second layer above the first layer.

The mark structure M may be created in two steps using a first subset and a second subset of the plurality of n lines. On a substrate 100, the mark structure M is defined by creating a first subset of the plurality of n lines e.g., M1, M3, M5 in a first layer 102 on the surface of the substrate 100. The lines M1, M3, M5 may be formed from a first material such as a metal. In between the lines M1, M3, M5 the first layer 102 may comprise a second material 103 with different optical properties that the first material. The second material may comprise silicon dioxide, for example.

On top of (i.e., overlying) the first layer 102, a second layer 104 is arranged that comprises a second subset of the plurality of n lines M2, M4 in this example. The lines M2, M4 may be formed from the first material or a material with substantially similar optical properties as the first material. In spaces 105 between lines M2, M4 either the second material or another third material may be present as filling material. The filling material should have different optical properties than the material of lines M2, M4. Alternatively, the space between adjacent lines in the second layer may be void.

The distribution of line positions in the first subset and in the second subset may be chosen in such a way that for each pair of lines adjacent in the mark structure, one line is in the first subset and the other line of the pair is in the second subset.

It is noted that in addition or alternatively the first subset and the second subset may comprise common lines at the same position in the mark structure. The mark structure is arranged such that the first subset of the plurality of lines has at least one line in common with the second subset of the plurality of lines.

Moreover, the position of one or more lines of the first subset in the first layer 102 may be in common with (i.e., substantially overlaying) the position of one or more lines of the second subset in the second layer 104. For example, line M3 may be printed in the first layer 102 and (again) in the second layer 104.

The mark structure as described above may provide useful results. A higher accuracy can be obtained as compared to the mark structure from the prior art because a larger number of pitches can be combined and averaged out during the pattern recognition step of the optical alignment procedure. Moreover, embodiments of the mark structure according to the present invention may be much less sensitive to product crosstalk (as caused by illuminating a part of a target portion during the optical alignment scan), because the pattern is generally more unique (making it possible to decrease an exclusion zone between the mark structure and the product area or target portion(s) for exclusion during the optical alignment scan). Also, embodiments of the present invention may allow a much more flexible approach in choosing the mark-design. Additionally, by splitting up the mark structure in different layers/exposures (in at least two subsets of lines) it can facilitate alignment to two layers at once from a single mark structure.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A mark structure on a substrate, the mark structure comprising:
   a plurality of n lines, n being equal to at least four, the lines extending substantially parallel to each other in a first direction and having a pitch between each pair of lines selected from the plurality of lines, the pitch being directed in a second direction substantially perpendicular to the first direction,
   wherein the pitch between each pair of selected lines differs from the pitch between each other pair of selected lines, and wherein a first subset of the plurality of lines is located in a first layer on the substrate and a second subset of the plurality of lines is located in a second layer above the first layer.

2. The mark structure according to claim 1, wherein the mark structure is arranged in a scribe lane of the substrate, the first direction being directed along a longitudinal direction of the scribe lane.

3. The mark structure according to claim 1, wherein the second subset of the plurality of lines has at least one line substantially overlying a corresponding line of the first subset of the plurality of lines.

4. The mark structure according to claim 1, wherein for each pair of lines in the plurality of lines that are adjacent in the second direction, one line of the pair is in the first subset and the other line of the pair is in the second subset.

5. The mark structure according to claim 1, wherein the mark structure is arranged for producing an optical interference pattern during an optical alignment in which the optical interference pattern displays a number of individual local intensity minima, that do not overlap.

6. The mark structure according to claim 1, wherein a width of the mark structure in the second direction is about 60 microns, the number of lines in the mark structure is five and the line width is about 2 microns.

7. The mark structure according to claim 6, wherein a first pitch between a first pair of two adjacent lines is about 9 microns, a second pitch between a second pair of two adjacent lines is about 13 microns, a third pitch between a third pair of two adjacent lines is about 17 microns and a fourth pitch between a fourth pair of two adjacent lines is about 5 microns.

8. A substrate for use in a process for producing a semiconductor device, the substrate having a mark structure comprising:
   a plurality of n lines, n being equal to at least four, the lines extending substantially parallel to each other in a first direction and having a pitch between each pair of lines selected from the plurality of lines, the pitch being directed in a second direction substantially perpendicular to the first direction,
   wherein the pitch between each pair of selected lines differs from the pitch between each other pair of selected lines, and wherein a first subset of the plurality of lines is located in a first layer on the substrate and a second subset of the plurality of lines is located in a second layer above the first layer.

* * * * *